(12) United States Patent
Chen et al.

(10) Patent No.: US 10,204,587 B2
(45) Date of Patent: Feb. 12, 2019

(54) SHIFT REGISTER UNIT AND DRIVE METHOD THEREOF, SHIFT REGISTER AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Mo Chen, Beijing (CN); Yang Zhang, Beijing (CN); Jilei Gao, Beijing (CN); Wuxia Fu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/750,417

(22) PCT Filed: Aug. 14, 2017

(86) PCT No.: PCT/CN2017/097386
§ 371 (c)(1),
(2) Date: Feb. 5, 2018

(87) PCT Pub. No.: WO2018/126691
PCT Pub. Date: Jul. 12, 2018

(65) Prior Publication Data
US 2019/0012976 A1    Jan. 10, 2019

(30) Foreign Application Priority Data

Jan. 3, 2017 (CN) .......................... 2017 1 0001940

(51) Int. Cl.
*G09G 3/36* (2006.01)
*G11C 19/28* (2006.01)

(52) U.S. Cl.
CPC ............ *G09G 3/3677* (2013.01); *G11C 19/28* (2013.01); *G11C 19/287* (2013.01); *G09G 2300/0408* (2013.01); *G09G 2310/0286* (2013.01)

(58) Field of Classification Search
CPC ............... G09G 3/3674; G09G 3/3677; G09G 2310/0286; G11C 19/28; G11C 19/287
See application file for complete search history.

(56) References Cited

U.S. PATENT DOCUMENTS 9,530,345 B2 * 12/2016 Li .................. G09G 3/2092
9,530,371 B2 * 12/2016 Yu .................. G09G 3/3674
(Continued)

FOREIGN PATENT DOCUMENTS

| CN | 102693692 A | 9/2012 |
| CN | 103426414 A | 12/2013 |

(Continued)

OTHER PUBLICATIONS

PCT International Search Report, Application No. PCT/CN2017/097386, dated Nov. 13, 2017, 5 pages.
(Continued)

*Primary Examiner* — Patrick O Neill
(74) *Attorney, Agent, or Firm* — Armstrong Teasdale LLP

(57) ABSTRACT

The present disclosure provides a shift register unit, which includes an input circuit, a reset circuit, a noise reduction circuit, and an output circuit. The input circuit is configured to control a voltage of a first node based on a first input signal and a second input signal, and control a voltage of a second node based on a first voltage and the voltage of the first node. The reset circuit is configured to reset the voltage
(Continued)

of the first node and the voltage of the second node. The noise reduction circuit is configured to maintain a reset voltage of the first node and a reset voltage of the second node. The output circuit is configured to provide, for an output terminal of the output circuit, a second clock signal from a second clock signal terminal or the second voltage. The shift register unit is composed of switch elements.

20 Claims, 5 Drawing Sheets

(56) References Cited

U.S. PATENT DOCUMENTS

| 9,715,860 | B2* | 7/2017 | Yang | G11C 19/28 |
| 9,905,192 | B2* | 2/2018 | Wu | G09G 3/20 |
| 9,990,897 | B2* | 6/2018 | Pang | G11C 19/287 |
| 2005/0220262 | A1 | 10/2005 | Moon | |

FOREIGN PATENT DOCUMENTS

| CN | 104658506 A | 5/2015 |
| CN | 104900210 A | 9/2015 |
| CN | 106228927 A | 12/2016 |
| CN | 106531112 A | 3/2017 |

OTHER PUBLICATIONS

PCT Written Opinion, Application No. PCT/CN2017/097386, dated Nov. 13, 2017, 9 pages.: with English translation.

* cited by examiner

SHIFT REGISTER UNIT AND DRIVE METHOD THEREOF, SHIFT REGISTER AND DISPLAY APPARATUS

CROSS REFERENCE TO RELATED APPLICATIONS

This patent application is a National Stage Entry of PCT/CN2017/097386 filed on Aug. 14, 2017, which claims the benefit and priority of Chinese Patent Application No. 201710001940.6 filed on Jan. 3, 2017, the disclosures of which are incorporated herein by reference in their entirety as a part of the present application.

BACKGROUND

The present disclosure relates to the field of display technologies, and more particularly to a shift register unit and a drive method thereof, a shift register, an array substrate, and a display apparatus.

A liquid crystal display (LCD) panel is formed by vertical and horizontal array pixel matrices. In a display process, a gate scanning signal is outputted by a gate drive circuit, and each pixel unit is scanned line by line. Gate driver on Array (GOA) is a technology for integrating a shift register onto an array substrate. As a shift register unit, each GOA unit sequentially transfers a scanning signal to its next GOA unit to turn on switching transistors in the pixel units row by row so as to input data signals of the pixel units.

BRIEF DESCRIPTION

Embodiments set forth herein provide a shift register unit and a drive method thereof, a shift register, an array substrate, and a display apparatus. The shift register unit occupies a smaller area of a TFT array substrate, and thus a narrow bezel design may be implemented.

A first aspect of the present disclosure provides a shift register unit. The shift register unit includes an input circuit, a reset circuit, a noise reduction circuit, and an output circuit. The input circuit is configured to control a voltage of a first node based on a first input signal from a first input terminal and a second input signal from a second input terminal, and control a voltage of a second node based on a first voltage from a first voltage terminal and the voltage of the first node. The reset circuit is configured to reset the voltage of the first node and the voltage of the second node based on a reset signal from a reset signal terminal and a second voltage from a second voltage terminal. The noise reduction circuit is configured to maintain a reset voltage of the first node and a reset voltage of the second node based on a first clock signal from a first clock signal terminal and the second voltage. The output circuit is configured to provide, to an output terminal of the output circuit, a second clock signal from a second clock signal terminal or the second voltage under the control of the voltage of the second node and the first clock signal. The shift register unit is composed of switch elements.

In embodiments of the present disclosure, the input circuit includes a first transistor, a second transistor, and a third transistor. A control electrode and a first electrode of the first transistor are coupled to the first input terminal, and a second electrode of the first transistor is coupled to the first node. A control electrode and a first electrode of the second transistor are coupled to the second input terminal, and a second electrode of the second transistor is coupled to the first node. A control electrode of the third transistor is coupled to the first node, a first electrode of the third transistor is coupled to the first voltage terminal, and a second electrode of the third transistor is coupled to the second node.

In embodiments of the present disclosure, the reset circuit includes a fourth transistor and a fifth transistor. A control electrode of the fourth transistor is coupled to the reset signal terminal, a first electrode of the fourth transistor is coupled to the second voltage terminal, and a second electrode of the fourth transistor is coupled to the first node. A control electrode of the fifth transistor is coupled to the reset signal terminal, a first electrode of the fifth transistor is coupled to the second voltage terminal, and a second electrode of the fifth transistor is coupled to the second node.

In embodiments of the present disclosure, the noise reduction circuit includes a sixth transistor, a seventh transistor, an eighth transistor, and a ninth transistor. A control electrode and a first electrode of the sixth transistor are coupled to the first clock signal terminal, and a second electrode of the sixth transistor is coupled to a third node. A control electrode of the seventh transistor is coupled to the first node, a first electrode of the seventh transistor is coupled to the second voltage terminal, and a second electrode of the seventh transistor is coupled to the third node. A control electrode of the eighth transistor is coupled to the third node, a first electrode of the eighth transistor is coupled to the second voltage terminal, and a second electrode of the eighth transistor is coupled to the first node. A control electrode of the ninth transistor is coupled to the third node, a first electrode of the ninth transistor is coupled to the second voltage terminal, and a second electrode of the ninth transistor is coupled to the second node.

In embodiments of the present disclosure, a proportion of a channel width-to-length ratio of the sixth transistor to that of the seventh transistor is less than ¼.

In embodiments of the present disclosure, the output circuit includes a tenth transistor and an eleventh transistor. A control electrode of the tenth transistor is coupled to the second node, a first electrode of the tenth transistor is coupled to the second clock signal terminal, and a second electrode of the tenth transistor is coupled to the output terminal. A control electrode of the eleventh transistor is coupled to the first clock signal terminal, a first electrode of the eleventh transistor is coupled to the second voltage terminal, and a second electrode of the eleventh transistor is coupled to the output terminal.

In embodiments of the present disclosure, all the transistors are N-type transistors, the first voltage terminal provides a high voltage, and the second voltage terminal provides a low voltage.

In embodiments of the present disclosure, all the transistors are P-type transistors, the first voltage terminal provides a low voltage, and the second voltage terminal provides a high voltage.

In embodiments of the present disclosure, the first clock signal and the second clock signal have the same period and amplitude, and have opposite phases, and a duty cycle of the first clock signal and a duty cycle of the second clock signal are both ½.

A second aspect of the present disclosure provides a drive method for driving the above shift register unit. In this drive method, during the first phase, the voltage of the first node is set to a first voltage based on a first input signal from a first input terminal, the voltage of the second node is set to the first voltage, and a second voltage is outputted from the output terminal of the shift register unit. During the second phase to the $n^{th}$ phase, the voltage of the first node is maintained at the first voltage based on the first input signal and a second input signal from a second input terminal, the voltage of the second node is maintained at the first voltage, and the first voltage is outputted from the output terminal of the shift register unit. During the $(n+1)^{th}$ phase to the $(n+m-1)^{th}$ phase, the voltage of the first node is maintained at the first voltage based on the second input signal, the voltage of the second node is maintained at the first voltage, and the second voltage is outputted from the output terminal of the shift register unit. During the $(n+m)^{th}$ phase, a reset signal is provided to the reset signal terminal to set the voltage of the first node and the voltage of the second node to the second voltage, and the second voltage is outputted from the output terminal of the shift register unit continually. The duration of the (n−1) phases is equal to a half of a period of the second clock signal, and the m is a natural number greater than 1 and less than n.

A third aspect of the present disclosure provides a shift register. The shift register includes a plurality of cascaded shift register units as mentioned above. A first input terminal of an $N^{th}$-stage shift register unit is coupled to an output terminal of an $(N-1)^{th}$-stage shift register unit, a second input terminal of the $N^{th}$-stage shift register unit is coupled to an output terminal of an $(N+1)^{th}$-stage shift register unit, an output terminal of the $N^{th}$-stage shift register unit is coupled to a first input terminal of the $(N+1)^{th}$-stage shift register unit, and a reset signal terminal of the $N^{th}$-stage shift register unit is coupled to an output terminal of an $(N+M-1)^{th}$-stage shift register unit. A first input terminal of a first-stage shift register unit is inputted by a scan enable signal. The first clock signal and the second clock signal inputted to shift register unit at each stage have the same clock period and amplitude and have opposite phases, and a duty cycle of the first clock signal and a duty cycle of the second clock signal are both ½. The phase of the first clock signal inputted to each of the shift register units at stages other than the first stage lags, by 1/K period, with respect to that of the first clock signal inputted to its previous-stage shift register unit. The K is an even number greater than 4, and the M is a natural number greater than K/2 and less than the K.

A fourth aspect of the present disclosure provides an array substrate, which includes the shift register as mentioned above.

A fifth aspect of the present disclosure provides a display apparatus, which includes the array substrate as mentioned above.

The shift register unit, the shift register, the array substrate and the display apparatus according to the embodiments of the present disclosure do not need to use a capacitor, which may reduce the area of the array substrate and can avoid a phenomenon that transistor characteristics are susceptible to variation due to excessive gate voltage of a key transistor resulted from boosting of the capacitor.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

DETAILED DESCRIPTION

Figure 1:
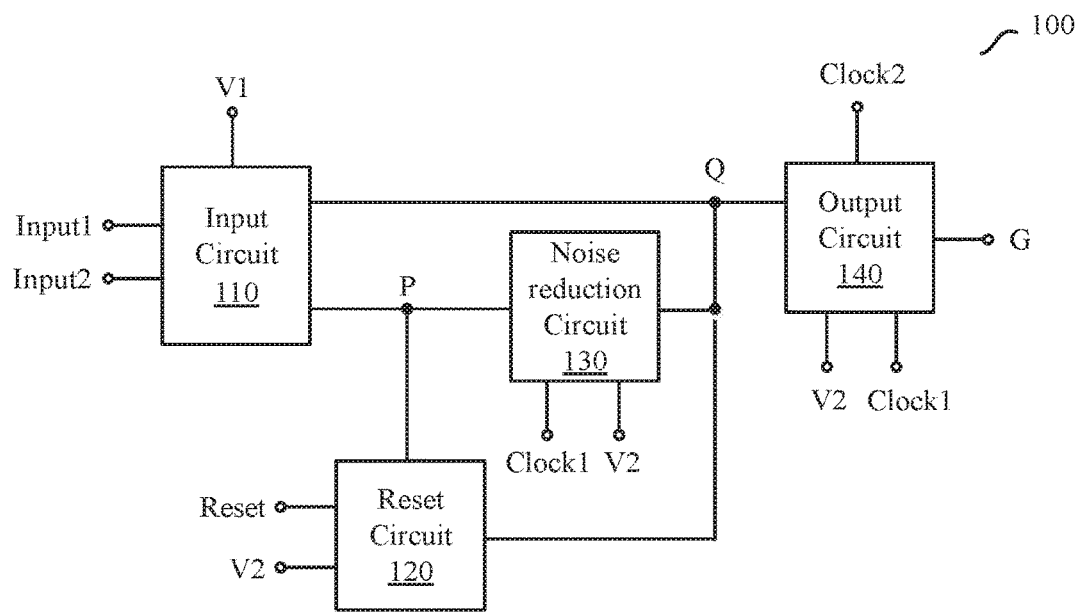
FIG. 1 is a schematic block diagram of a shift register unit according to an embodiment of the present disclosure.

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a transistor is used as an example of a switch element. A source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an P-type transistor. Therefore, in the embodiments of the present disclosure, a controlled intermediate terminal of the transistor is referred to as a control electrode, a signal input terminal is referred to as a first electrode, and a signal output terminal is referred to as a second electrode. The transistors used in the embodiments of the present disclosure mainly are switching transistors. It should be appreciated that in the embodiments of the present disclosure, any controlled switching device with a gating signal input may be employed to implement functions of a switching element, a controlled intermediate terminal of the switching device used for receiving a control signal (e.g., for turning the controlled switching device on/off) is referred to as a control electrode, a signal input terminal is referred to as a first electrode, and a signal output terminal is referred as a second electrode. In addition, terms such as "first" and "second" are only used to distinguish one element (or a part of the element) from another element (or another part of this element).

The existing GOA circuits typically include a capacitor boosting circuit, which utilizes a capacitor to keep voltage so as to ensure that the gate voltage outputted from a transistor holds more than two clock pulses, thereby implementing a scanning pulse output. However, on an array substrate, implementing a capacitor generally needs to occupy larger space, which is disadvantageous to the development tendency to narrow bezel of a liquid crystal display panel.

Moreover, to fully turn on a transistor of a pixel unit and ensure a charging rate of a pixel electrode, the high voltage Vgh of a scanning signal needs to reach more than 25V. The capacitor boosting circuit of the existing GOA circuit can enable the voltage of some critical nodes of a GOA internal circuit to rise to a voltage twice of the high voltage Vgh, namely, reaching 50V or more. When a transistor operates at such a high voltage, characteristics of the transistor are susceptible to variation (e.g., causing drift of a threshold voltage), which leads to a poorer stability of a GOA unit in a long-time panel display process and interferes with the normal scanning signal output.

FIG. 1 illustrates a schematic block diagram of a shift register unit 100 according to an embodiment of the present disclosure. As shown in FIG. 1, the shift register unit 100 may include an input circuit 110, a reset circuit 120, a noise reduction circuit 130, and an output circuit 140.

The input circuit 110 is connected to the reset circuit 120, the noise reduction circuit 130 and the output circuit 140, and is configured to control a voltage of a first node P based on a first input signal from a first input terminal Input1 and a second input signal from a second input terminal Input2, and to control a voltage of a second node Q based on a first voltage from a first voltage terminal V1 and the voltage of the first node P.

The reset circuit 120 is connected to the input circuit 110, the noise reduction circuit 130 and the output circuit 140, and is configured to reset the voltage of the first node P and the voltage of the second node Q based on a reset signal from a reset signal terminal Reset and a second voltage from a second voltage terminal V2.

The noise reduction circuit 130 is connected to the input circuit 110, the reset circuit 120 and the output circuit 140, and is configured to maintain the reset voltage of the first node P and of the second node Q based on a first clock signal from a first clock signal terminal Clock1 and the second voltage.

The output circuit 140 is connected to the input circuit 110, the reset circuit 120 and the noise reduction circuit 130, and is configured to provide, to an output terminal G of the output circuit 140, a second clock signal from a second clock signal terminal Clock2 or the second voltage under the control of the voltage of the second node Q and the first clock signal.

In the embodiments of the present disclosure, the shift register unit 100 is composed of switch elements, and does not include any capacitor for keeping voltage in a conventional shift register unit.

Figure 2:
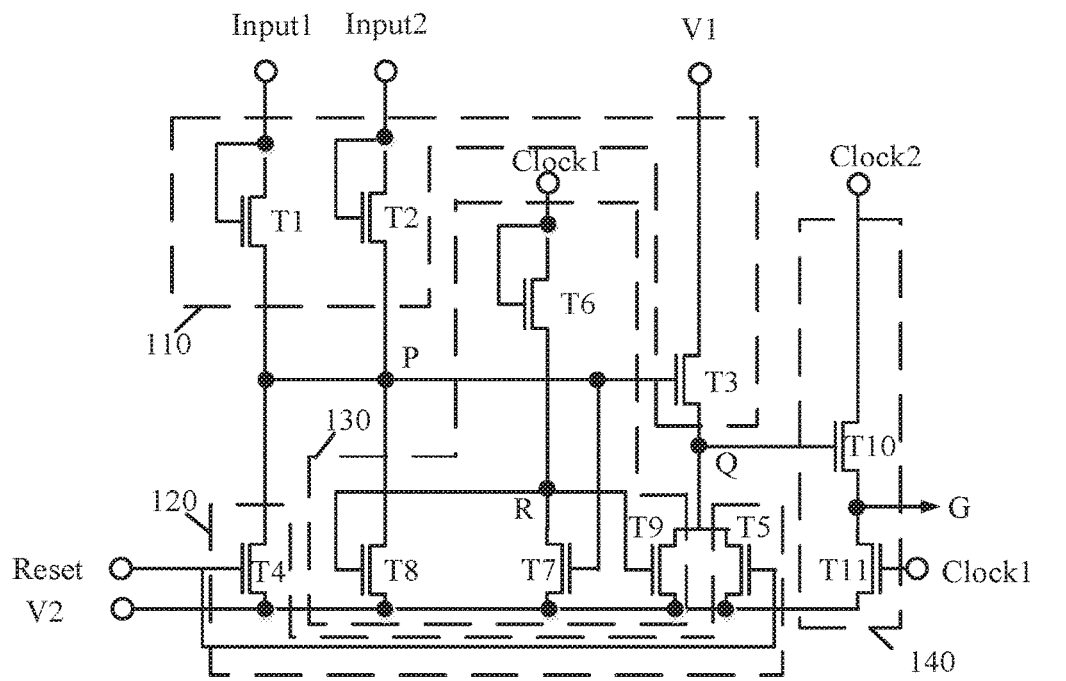
FIG. 2 is an exemplary circuit diagram of a shift register unit according to an embodiment of the present disclosure.

FIG. 2 illustrates an exemplary circuit diagram of the shift register unit 100 according to an embodiment of the present disclosure. As shown in FIG. 2, the input circuit 110 includes a first transistor T1, a second transistor T2, and a third transistor T3. A control electrode and a first electrode of the first transistor T1 are coupled to the first input terminal Input1, and a second electrode of the first transistor T1 is coupled to the first node P. A control electrode and a first electrode of the second transistor T2 are coupled to the second input terminal Input2, and a second electrode of the second transistor T2 is coupled to the first node P. A control electrode of the third transistor T3 is coupled to the first node P, a first electrode of the third transistor T3 is coupled to the first voltage terminal V1, and a second electrode of the third transistor T3 is coupled to the second node Q.

The reset circuit 120 includes a fourth transistor T4 and a fifth transistor T5. A control electrode of the fourth transistor T4 is coupled to the reset signal terminal Reset, a first electrode of the fourth transistor T4 is coupled to the second voltage terminal V2, and a second electrode of the fourth transistor T4 is coupled to the first node P. A control electrode of the fifth transistor T5 is coupled to the reset signal terminal Reset, a first electrode of the fifth transistor T5 is coupled to the second voltage terminal V2, and a second electrode of the fifth transistor T5 is coupled to the second node Q.

The noise reduction circuit 130 includes a sixth transistor T6, a seventh transistor T7, an eighth transistor T8, and a ninth transistor T9. A control electrode and a first electrode of the sixth transistor T6 are coupled to the first clock signal terminal Clock1, and a second electrode of the sixth transistor T6 is coupled to a third node R. A control electrode of the seventh transistor T7 is coupled to the first node P, a first electrode of the seventh transistor T7 is coupled to the second voltage terminal V2, and a second electrode of the seventh transistor T7 is coupled to the third node R. A control electrode of the eighth transistor T8 is coupled to the third node R, a first electrode of the eighth transistor T8 is coupled to the second voltage terminal V2, and a second electrode of the eighth transistor T8 is coupled to the first node P. A control electrode of the ninth transistor T9 is coupled to the third node R, a first electrode of the ninth transistor T9 is coupled to the second voltage terminal V2, and a second electrode of the ninth transistor T9 is coupled to the second node Q.

In an example, a proportion of a channel width-to-length ratio of the sixth transistor T6 to that of the seventh transistor T7 is set, so that when the sixth transistor T6 and the seventh transistor T7 are turned on simultaneously and the voltage of the second voltage terminal V2 is the second voltage (even though the first clock signal is at the first voltage), the voltage of the third node R is the second voltage. For example, the proportion of the channel width-to-length ratio of the sixth transistor T6 to that of the seventh transistor T7 is set to less than ¼.

The output circuit 140 includes a tenth transistor T10 and an eleventh transistor T11. A control electrode of the tenth transistor T10 is coupled to the second node Q, a first electrode of the tenth transistor T10 is coupled to the second clock signal terminal Clock2, and a second electrode of the tenth transistor T10 is coupled to the output terminal G. A control electrode of the eleventh transistor T11 is coupled to the first clock signal terminal Clock1, a first electrode of the eleventh transistor T11 is coupled to the second voltage terminal V2, and a second electrode of the eleventh transistor T11 is coupled to the output terminal G.

In this embodiment, the first clock signal from the first clock signal terminal Clock1 and the second clock signal from the second clock signal terminal Clock2 have the same clock period and amplitude, and have opposite phases, and a duty cycle of the first clock signal and a duty cycle of the second clock signal are both ½.

Figure 3:
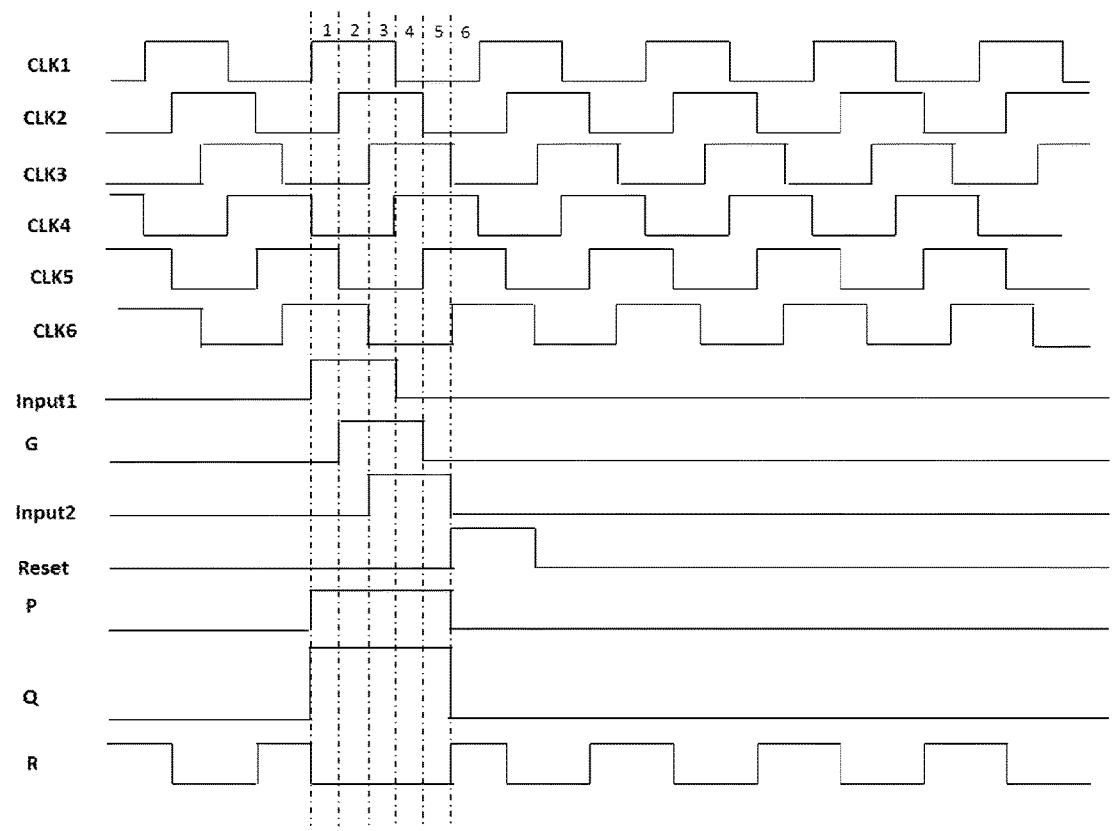
FIG. 3 is a timing diagram of each signal of the shift register unit as shown in FIG. 2.

FIG. 3 illustrates a timing diagram of each signal of the shift register unit 100 as shown in FIG. 2. A working process of the shift register unit 100 as shown in FIG. 2 is described in detail below with reference to the timing diagram as shown in FIG. 3. In the following description, supposing all the transistors are N-type transistors, the first voltage outputted by the first voltage terminal V1 is a high voltage v1, and the second voltage outputted by the second voltage terminal V2 is a low voltage v2. The first clock signal terminal Clock1 outputs a first clock signal CLK5. The second clock signal terminal Clock2 outputs a second clock signal CLK2. The first clock signal CLK5 and the second clock signal CLK2 have the same clock period and amplitude, and have opposite phases, and a duty cycle of the first clock signal CLK5 and a duty cycle of the second clock signal CLK2 are both ½. Herein, the voltage v1 of the first voltage terminal V1 is greater than a high voltage Vgh of the clock signal (CLK2 and CLK5). Reference is made below taking an example where a clock period is equally divided into six phases. Hereinafter, "1" denotes a high voltage, and "0" denotes a low voltage.

During the first phase (initialization phase), Input1=1, Input2=0, CLK5=1, CLK2=0, Reset=0, V1=1, and V2=0.

The high voltage Vgh is inputted to the first input terminal Input1 as a beginning of a working period of a frame of the shift register unit 100. Because the high voltage Vgh is inputted to the first input terminal Input1, and the first transistor T1 is turned on, the voltage of the first node P rises to the high voltage Vgh. The high voltage Vgh of the first node P turns on the third transistor T3, so that the voltage of the second node Q rises to the high voltage v1 of the first voltage terminal V1. Meanwhile, the high voltage Vgh of the first node P turns on the seventh transistor T7, and the high voltage Vgh of the first clock signal CLK5 turns on the sixth transistor T6. The voltage of the third node R may be set to a low voltage by designing the proportion of the channel width-to-length ratio of the sixth transistor T6 to that of the seventh transistor T7 (for example, the proportion of the channel width-to-length ratio of the sixth transistor T6 to that of the seventh transistor T7 is less than ¼). The low voltage of the third node R turns off the eighth transistor T8 and the ninth transistor T9, so that the voltage of the first node P and of the second node Q is not affected by the second voltage terminal V2. Therefore, the high voltage v1 of the second node Q turns on the tenth transistor T10 (the voltage v1 of the first voltage terminal V1 is set higher than the high voltage Vgh of the first clock signal so that it is ensured that the tenth transistor T10 is fully turned on), so that the low voltage v2 is outputted from the output terminal G in accordance with the second clock signal CLK2. Also, because the first clock signal CLK5 is at the high voltage Vgh, and the eleventh transistor T11 is turned on, the low voltage v2 is outputted from the output terminal G.

During the second phase (pixel scanning phase), Input1=1, Input2=0, CLK5=0, CLK2=1, Reset=0, V1=1, and V2=0.

Similar to the first phase, the high voltage Vgh is still inputted to the first input terminal Input1 and the first voltage terminal V1, so that the high voltage is maintained at the first node P and the second node Q. Because the first node P is at the high voltage Vgh, and the seventh transistor T7 maintains an on state, the third node R remains at the low voltage. Therefore, the voltage of the first node P and of the second node Q is not affected by the second voltage terminal V2. Because the first clock signal CLK5 is at the low voltage, and the eleventh transistor T11 is turned off, the output terminal G is not affected by the second voltage terminal V2. Via the tenth transistor T10, the high voltage Vgh is outputted from the output terminal G in accordance with the second clock signal CLK2, to start the pixel scanning.

During the third phase (pixel scanning phase), Input1=1, Input2=1, CLK5=0, CLK2=1, Reset=0, V1=1, and V2=0.

Similar to the previous phase, the high voltage Vgh is still inputted to the first input terminal Input1, so that the voltage of the first node P, of the second node Q, and of the third node R remain unchanged. In addition, the high voltage Vgh is inputted to the second input terminal Input2, so that the second transistor T2 is turned on, and the high voltage Vgh is outputted from the second electrode of the second transistor T2. Therefore, the second input terminal Input2 and the first input terminal Input1 keep the voltage of the first node P at the high voltage Vgh simultaneously. Because the first clock signal CLK5 is at the low voltage, and the eleventh transistor T11 is turned off, the output terminal G is not affected by the second voltage terminal V2. Via the tenth transistor T10, the high voltage Vgh is outputted from the output terminal G in accordance with the second clock signal CLK2, to continue the pixel scanning.

During the fourth phase (pixel scanning phase), Input1=0, Input2=1, CLK5=0, CLK2=1, Reset=0, V1=1, and V2=0.

The first input terminal Input1 is changed to be at the low voltage, but the second input terminal Input2 is at the high voltage Vgh. Therefore, similar to the previous phases, the voltage of the first node P, of the second node Q, and of the third node R remain unchanged. Because the first clock signal CLK5 is at the low voltage, and the eleventh transistor T11 is turned off, the output terminal G is not affected by the second voltage terminal V2. Via the tenth transistor T10, the high voltage Vgh is outputted from the output terminal G in accordance with the second clock signal CLK2, to continue the pixel scanning.

During the fifth phase (scanning termination phase), Input1=0, Input2=1, CLK5=1, CLK2=0, Reset=0, V1=1, and V2=0.

Similar to the fourth phase, the second input terminal Input2 is still at the high voltage Vgh, so that the voltage of the first node P, of the second node Q, and of the third node R remain unchanged, and thus the tenth transistor T10 is turned on continually. At this moment, the third node R still maintains at the low voltage, so that the voltage of the first node P and of the second node Q is not affected by the second voltage terminal V2. In this phase, the second clock signal CLK2 drops to the low voltage, so that the output terminal G is at the low voltage v2 in accordance with the second clock signal CLK2. Meanwhile, the first clock signal CLK5 is changed to be at the high voltage Vgh, and thus the eleventh transistor T11 is turned on, so that the voltage of the output terminal G is changed to be at the low voltage v2 from the second voltage terminal V2. The first clock signal CLK5 and the second clock signal CLK2 are synchronously changed, which ensures that the voltage of the output terminal G rapidly drops to the low voltage v2, thereby terminating the pixel scanning.

During the sixth phase (resetting phase), Input1=0, Input2=0, CLK5=1, CLK2=0, Reset=1, V1=1, and V2=0.

The high voltage inputted by the reset signal terminal Reset turns on the fourth transistor T4 and the fifth transistor T5, so that the voltage of the first node P and of the second node Q are changed to the voltage of the second voltage terminal V2 (namely, drops to the low voltage v2). Because the first node P is at the low voltage, the seventh transistor T7 is turned off. The high voltage Vgh from the first clock signal CLK5 turns the sixth transistor T6 on. At this moment, the voltage of the third node R is increased to the high voltage by the first clock signal CLK5, so that the eighth transistor T8 and the ninth transistor T9 are turned on. Likewise, the first node P and the second node Q are connected to the second voltage terminal V2 (that is, the voltage of the first node P and of the second node Q are changed to the low voltage v2 of the second voltage terminal V2), so that noise of the output terminal G of the shift register unit 100 is reduced. In addition, the eleventh transistor T11 is turned on, so that the output terminal G is connected to the second voltage terminal V2, and the low voltage v2 is outputted from the output terminal G.

Before the beginning of a next frame of the shift register unit 100, the third node R changes to the high voltage every time when the first clock signal CLK5 is at the high voltage, so that the first node P and the second node Q are connected to the second voltage terminal V2. Meanwhile the eleventh transistor T11 is turned on, so that the output terminal G is connected to the second voltage terminal V2. Therefore, the shift register unit 100 according to this embodiment can play a role of stabilizing voltage and reducing noise between two adjacent frames.

As can be seen from FIG. 3, in an alternative example, the above resetting phase also may be any ⅙ period after the sixth phase and before the second clock signal CLK2 is changed to the high voltage.

Furthermore, those skilled in the art should know that in an alternative embodiment of this embodiment, all the transistors in the shift register unit 100 as shown in FIG. 2 may be P-type transistors. In this case, the first voltage outputted by the first voltage terminal V1 is a low voltage v1, and the second voltage outputted by the second voltage terminal V2 is a high voltage v2. The first clock signal CLK5 and the second clock signal CLK2 have the same clock period and amplitude, and have opposite phases, and a duty cycle of the first clock signal CLK5 and of the second clock signal CLK2 are both ½. The voltage v1 of the first voltage terminal V1 is less than a low voltage Vgl of the clock signal (CLK2 and CLK5). In this alternative embodiment, the voltage (not shown) of each signal in each phase is opposite to that of each signal in each phase as shown in FIG. 3.

Figure 4:
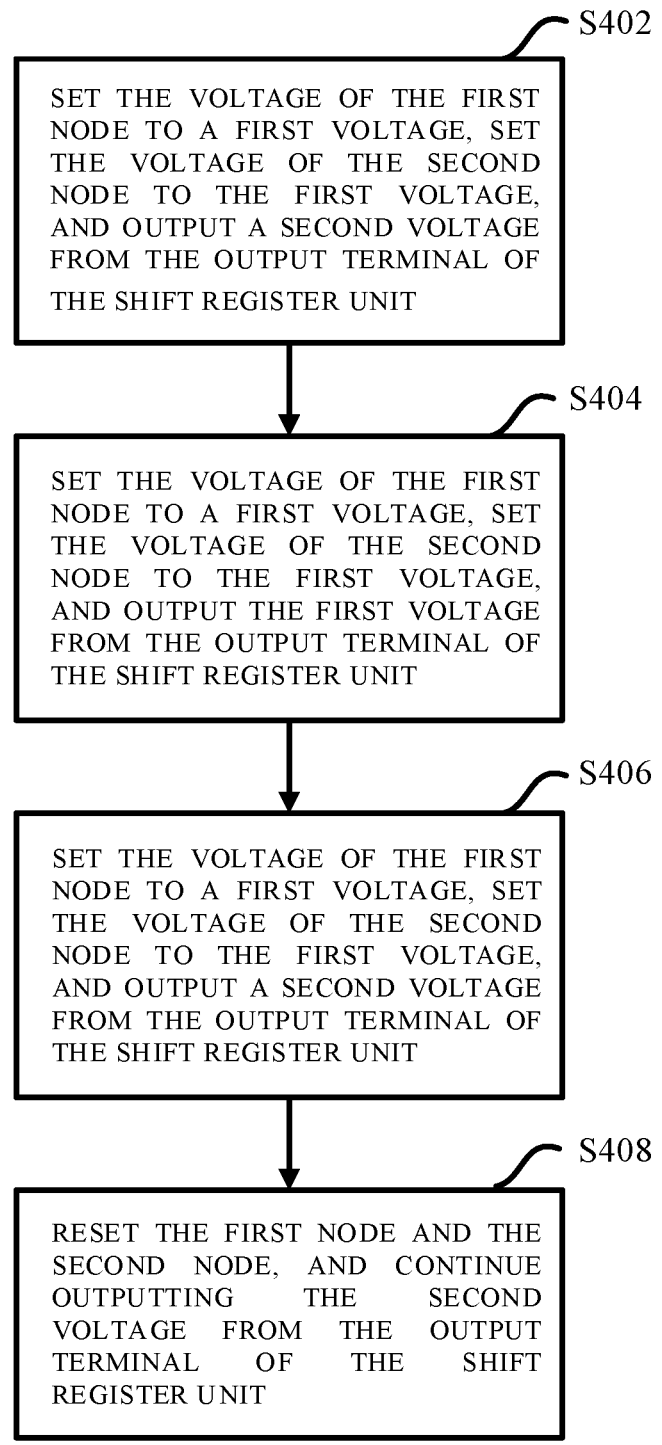
FIG. 4 is a schematic flowchart of a drive method for driving the shift register unit as shown in FIG. 1 according to an embodiment of the present disclosure.

FIG. 4 is a schematic flowchart of a drive method for driving the shift register unit 100 as shown in FIG. 1 according to an embodiment of the present disclosure.

In Step S402, during a first phase, the voltage of the first node is set to the first voltage based on the first input signal from the first input terminal, the first voltage is provided to the first voltage terminal so as to set the voltage of the second node to the first voltage, and the first voltage is provided to the first clock signal terminal and the second voltage is provided to the second clock signal terminal so that the second voltage is outputted from the output terminal of the shift register unit 100.

In Step S404, during a second phase to an $n^{th}$ phase, the voltage of the first node is maintained at the first voltage based on the first input signal and the second input signal from the second input terminal, the first voltage is provided to the first voltage terminal so that the voltage of the second node is maintained at the first voltage, and the second voltage is provided to the first clock signal terminal and the first voltage is provided to the second clock signal terminal so that the first voltage is outputted from the output terminal of the shift register unit 100.

In Step S406, during an $(n+1)^{th}$ phase to an $(n+m-1)^{at}$ phase, the voltage of the first node is maintained at the first voltage based on the second input signal, the first voltage is provided to the first voltage terminal so that the voltage of the second node is maintained at the first voltage, and the first voltage is provided to the first clock signal terminal and the second voltage is provided to the second clock signal terminal so that the second voltage is outputted from the output terminal of the shift register unit 100.

In Step S408, during an $(n+m)^{th}$ a reset signal is) provided to the reset signal terminal to set the voltage of the first node and the voltage of the second node to the second voltage, and the first voltage is provided to the first clock signal terminal and the second voltage is provided to the second clock signal terminal so that the second voltage is kept outputting from the output terminal of the shift register unit 100. In an example, the noise of the output terminal of the shift register unit 100 is reduced by the noise reduction circuit.

In this embodiment, the duration of the (n−1) phase is equal to a half of a period of the second clock signal, and m is a natural number greater than 1 and less than n.

In an example of this embodiment, all transistors in the shift register unit 100 are N-type transistors, and the first voltage is a high voltage whereas the second voltage is a low voltage.

In another example of this embodiment, all transistors in the shift register unit 100 are P-type transistors, and the first voltage is a low voltage whereas the second voltage is a high voltage.

Figure 5:
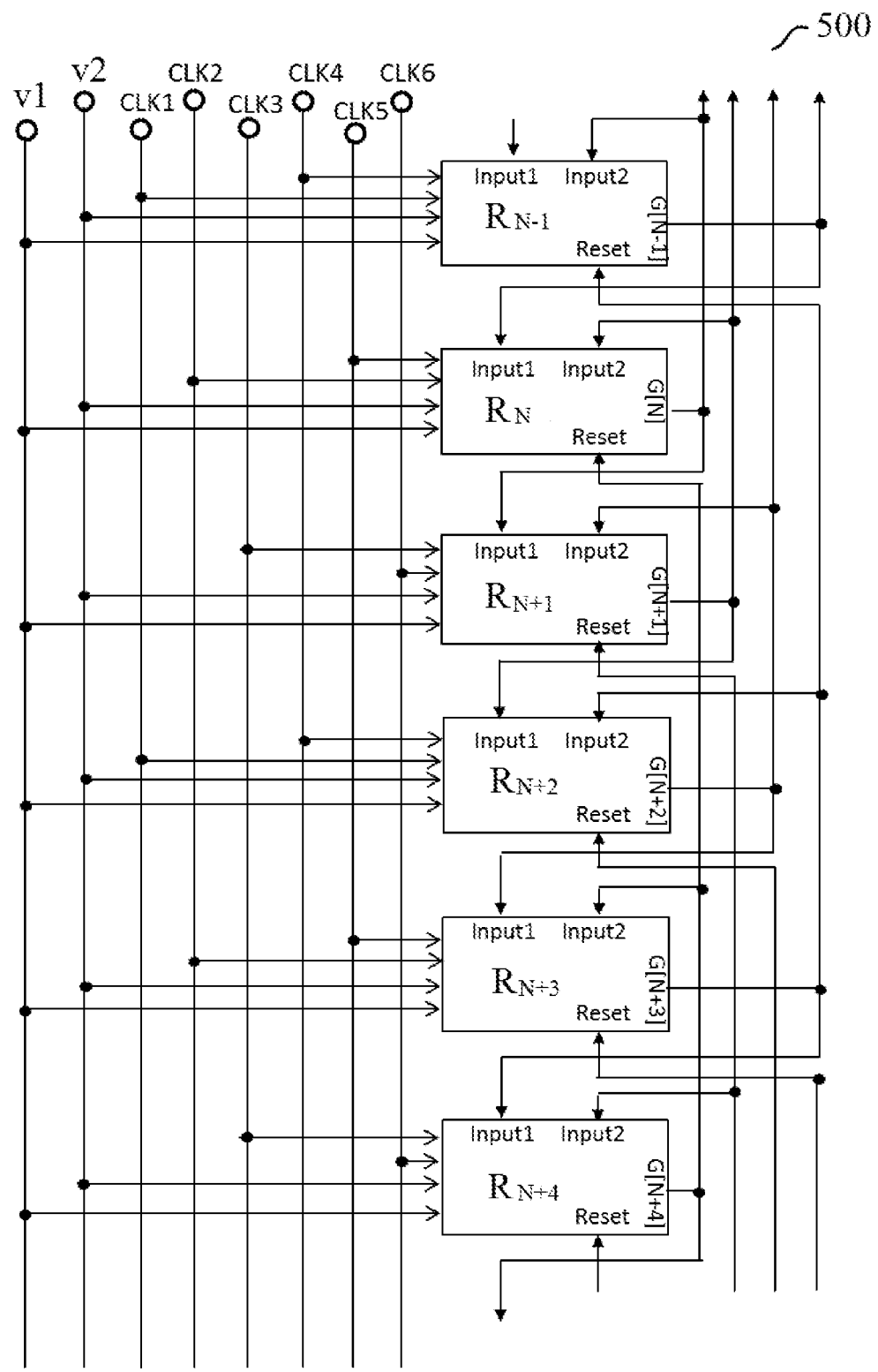
FIG. 5 is an exemplary circuit diagram of a shift register according to an embodiment of the present disclosure.

FIG. 5 is an exemplary circuit diagram of a shift register 500 according to an embodiment of the present disclosure. As shown in FIG. 5, the shift register 500 may include a plurality of cascaded shift register units $R_1, \ldots, R_N, R_{N+1}$ and so on. Herein, the N denotes a certain stage of the plurality of cascaded shift register units in the shift register 500, but does not denote a total number of shift register units included in the shift register 500.

In this embodiment, the $N^{th}$-stage shift register unit $R_N$ is the shift register unit 100 as shown in FIG. 1 or FIG. 2. A first input terminal Input1 [N] of the $N^{th}$-stage shift register unit $R_N$ is coupled to an output terminal G[N−1] of an $(N−1)^{th}$-stage shift register unit. A second input terminal Input2[N] of the $N^{th}$-stage shift register unit is coupled to an output terminal G[N+1] of an $(N+1)^{th}$-stage shift register unit. An output terminal G[N] of the $N^{th}$-stage shift register unit is coupled to a first input terminal Input1 [N+1] of the $(N+1)^{th}$-stage shift register unit. A reset signal terminal Reset of the $N^{th}$-stage shift register unit is coupled to an output terminal G[N+M−1] of an $(N+M−1)^{th}$-stage shift register unit.

For example, when N=1, a first input terminal Input1 [1] of the first-stage shift register unit $R_1$ is inputted by a scan enable signal. A second input terminal Input2[1] of the first-stage shift register unit $R_1$ is coupled to an output terminal G[2] of the second-stage shift register unit. An output terminal G[1] of the first-stage shift register unit is coupled to a first input terminal Input1 [2] of the second-stage shift register unit. A reset signal terminal Reset of the first-stage shift register unit is coupled to an output terminal G[M] of an $M^{th}$-stage shift register unit.

When N=2, a first input terminal Input1 [2] of the second-stage shift register unit $R_2$ is coupled to the output terminal G[1] of the first-stage shift register unit. A second input terminal Input2[2] of the second-stage shift register unit is coupled to an output terminal G[3] of a third-stage shift register unit. The output terminal G[2] of the second-stage shift register unit is coupled to a first input terminal Input1 [3] of the third-stage shift register unit. A reset signal terminal Reset of the second-stage shift register unit is coupled to an output terminal G[M+1] of an $(M+1)^{th}$-stage shift register unit.

The first clock signal and the second clock signal inputted to shift register unit at each stage have the same clock period and amplitude and have opposite phases, and a duty cycle of the first clock signal and of the second clock signal are both ½. The phase of the first clock signal inputted to each of the shift register units at stages other than the first stage lags, by 1/K period, with respect to that of the first clock signal inputted to its previous-stage shift register unit. In this embodiment, the K is an even number greater than 4, which is used for indicating that a clock period is evenly divided into K phases. The M is a natural number greater than K/2 and less than K. In the example as shown in FIG. 5, the K equals to 6, and the M equals to 5.

Figure 6:
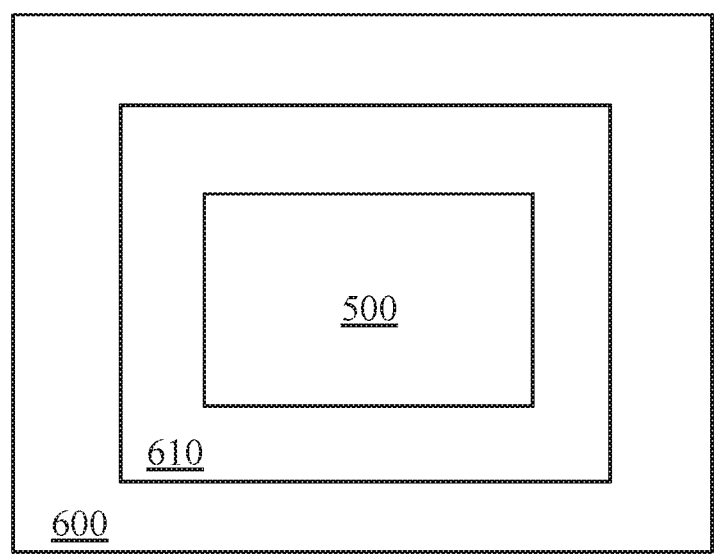
FIG. 6 illustrates a schematic structural diagram of a display apparatus according to an embodiment of the present disclosure.

FIG. 6 illustrates a schematic structural diagram of a display apparatus 600 according to an embodiment of the present disclosure. The display apparatus 600 may include an array substrate 610. The array substrate 610 may include the shift register 500 as shown in FIG. 5.

As can be seen from the above description, the shift register unit and the drive method thereof, the array substrate and the display apparatus according to the embodiments of the present disclosure do not need to use a capacitor, which may reduce the area of the array substrate and implement a narrow bezel design. Furthermore, the embodiments of the present disclosure can avoid a phenomenon that transistor characteristics are susceptible to variation due to excessive gate voltage of a critical transistor resulted from boosting of the capacitor.

The display apparatus provided by the embodiments of the present disclosure may be used in any product having a display function, such as an electronic paper display, a mobile phone, a tablet computer, a TV set, a notebook computer, a digital photo frame, a wearable device or a navigation apparatus, and so on.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A shift register unit comprising an input circuit, a reset circuit, a noise reduction circuit, and an output circuit,
    wherein the input circuit is configured to control a voltage of a first node based on a first input signal from a first input terminal and a second input signal from a second input terminal, and control a voltage of a second node based on a first voltage from a first voltage terminal and the voltage of the first node;
    wherein the reset circuit is configured to reset the voltage of the first node and the voltage of the second node based on a reset signal from a reset signal terminal and a second voltage from a second voltage terminal;
    wherein the noise reduction circuit is configured to maintain a reset voltage of the first node and a reset voltage of the second node based on a first clock signal from a first clock signal terminal and the second voltage;
    wherein the output circuit is configured to provide, to an output terminal of the output circuit, a second clock signal from a second clock signal terminal or the second voltage under the control of the voltage of the second node and the first clock signal; and
    wherein the shift register unit is composed of switch elements.

2. The shift register unit according to claim 1, wherein the input circuit comprises a first transistor, a second transistor, and a third transistor;
    wherein a control electrode and a first electrode of the first transistor are coupled to the first input terminal, and wherein a second electrode of the first transistor is coupled to the first node;
    wherein a control electrode and a first electrode of the second transistor are coupled to the second input terminal, and wherein a second electrode of the second transistor is coupled to the first node; and
    wherein a control electrode of the third transistor is coupled to the first node, wherein a first electrode of the third transistor is coupled to the first voltage terminal, and wherein a second electrode of the third transistor is coupled to the second node.

3. The shift register unit according to claim 2, wherein the reset circuit comprises a fourth transistor and a fifth transistor;
    wherein a control electrode of e fourth transistor is coupled to the reset signal terminal, wherein a first electrode of the fourth transistor is coupled to the second voltage terminal, and wherein a second electrode of the fourth transistor is coupled to the first node; and
    wherein a control electrode of the fifth transistor is coupled to the reset signal terminal, wherein a first electrode of the fifth transistor is coupled to the second voltage terminal, and wherein a second electrode of the fifth transistor is coupled to the second node.

4. The shift register unit according to claim 3, wherein the noise reduction circuit comprises a sixth transistor, a seventh transistor, an eighth transistor, and a ninth transistor;
    wherein a control electrode and a first electrode of the sixth transistor are coupled to the first clock signal terminal, and wherein a second electrode of the sixth transistor is coupled to a third node;
    wherein a control electrode of the seventh transistor is coupled to the first node, wherein a first electrode of the seventh transistor is coupled to the second voltage terminal, and wherein a second electrode of the seventh transistor is coupled to the third node;
    wherein a control electrode of the eighth transistor is coupled to the third node, wherein a first electrode of the eighth transistor is coupled to the second voltage terminal, and wherein a second electrode of the eighth transistor is coupled to the first node; and
    wherein a control electrode of the ninth transistor is coupled to the third node, wherein a first electrode of the ninth transistor is coupled to the second voltage terminal, and wherein a second electrode of the ninth transistor is coupled to the second node.

5. The shift register unit according to claim 4, wherein a proportion of a channel width-to-length ratio of the sixth transistor to that of the seventh transistor is less than ¼.

6. The shift register unit according to claim 5, wherein the output circuit comprises a tenth transistor and an eleventh transistor;

wherein a control electrode of the tenth transistor is coupled to the second node, wherein a first electrode of the tenth transistor is coupled to the second clock signal terminal, and wherein a second electrode of the tenth transistor is coupled to the output terminal; and wherein a control electrode of the eleventh transistor is coupled to the first clock signal terminal, wherein a first electrode of the eleventh transistor is coupled to the second voltage terminal, and wherein a second electrode of the eleventh transistor is coupled to the output terminal.

7. The shift register unit according to claim 6, wherein the first clock signal and the second clock signal have the same period and amplitude and have opposite phases, and wherein a duty cycle of the first clock signal and a duty cycle of the second clock signal are both ½.

8. The shift register unit according to claim 7,
wherein all the transistors are N-type transistors, wherein the first voltage terminal provides a high voltage, and wherein the second voltage terminal provides a low voltage;
or wherein all the transistors are P-type transistors, wherein the first voltage terminal provides a low voltage, and wherein the second voltage terminal provides a high voltage.

9. The shift register unit according to claim 4, wherein the output circuit comprises a tenth transistor and an eleventh transistor;
wherein a control electrode of the tenth transistor is coupled to the second node, wherein a first electrode of the tenth transistor is coupled to the second clock signal terminal, and wherein a second electrode of the tenth transistor is coupled to the output terminal; and
wherein a control electrode of the eleventh transistor is coupled to the first clock signal terminal, wherein a first electrode of the eleventh transistor is coupled to the second voltage terminal, and wherein a second electrode of the eleventh transistor is coupled to the output terminal.

10. The shift register unit according to claim 1, wherein the reset circuit comprises a fourth transistor and a fifth transistor;
wherein a control electrode of the fourth transistor is coupled to the reset signal terminal, wherein a first electrode of the fourth transistor is coupled to the second voltage terminal, and wherein a second electrode of the fourth transistor is coupled to the first node; and
wherein a control electrode of the fifth transistor is coupled to the reset signal terminal, wherein a first electrode of the fifth transistor is coupled to the second voltage terminal, and wherein a second electrode of the fifth transistor is coupled to the second node.

11. The shift register unit according to claim 1, wherein the noise reduction circuit comprises a sixth transistor, a seventh transistor, an eighth transistor, and a ninth transistor;
wherein a control electrode and a first electrode of the sixth transistor are coupled to the first clock signal terminal, and wherein a second electrode of the sixth transistor is coupled to a third node;
wherein a control electrode of the seventh transistor is coupled to the first node, wherein a first electrode of the seventh transistor is coupled to the second voltage terminal, and wherein a second electrode of the seventh transistor is coupled to the third node;
wherein a control electrode of the eighth transistor is coupled to the third node, wherein a first electrode of the eighth transistor is coupled to the second voltage terminal, and wherein a second electrode of the eighth transistor is coupled to the first node; and wherein a control electrode of the ninth transistor is coupled to the third node, wherein a first electrode of the ninth transistor is coupled to the second voltage terminal, and wherein a second electrode of the ninth transistor is coupled to the second node.

12. The shift register unit according to claim 11, wherein a proportion of a channel width-to-length ratio of the sixth transistor to that of the seventh transistor is less than ¼.

13. The shift register unit according to claim 1, wherein the output circuit comprises a tenth transistor and an eleventh transistor;
wherein a control electrode of the tenth transistor is coupled to the second node, wherein a first electrode of the tenth transistor is coupled to the second clock signal terminal, and wherein a second electrode of the tenth transistor is coupled to the output terminal; and
wherein a control electrode of the eleventh transistor is coupled to the first clock signal terminal, wherein a first electrode of the eleventh transistor is coupled to the second voltage terminal, and wherein a second electrode of the eleventh transistor is coupled to the output terminal.

14. The shift register unit according to claim 1, wherein all the switch elements are N-type transistors, wherein the first voltage terminal provides a high voltage, and wherein the second voltage terminal provides a low voltage.

15. The shift register unit according to claim 1, wherein all the switch elements are P-type transistors, wherein the first voltage terminal provides a low voltage, and wherein the second voltage terminal provides a high voltage.

16. The shift register unit according to claim 1, wherein the first clock signal and the second clock signal have the same period and amplitude and have opposite phases, and wherein a duty cycle of the first clock signal and a duty cycle of the second clock signal are both ½.

17. A drive method for driving the shift register unit according to claim 1 comprising:
during the first phase, setting the voltage of the first node to a first voltage based on the first input signal from the first input terminal, setting the voltage of the second node to the first voltage, and outputting a second voltage from the output terminal of the shift register unit;
during the second phase to the $n^{th}$ phase, maintaining the voltage of the first node at the first voltage based on the first input signal and a second input signal from a second input terminal, maintaining the voltage of the second node at the first voltage, and outputting the first voltage from the output terminal of the shift register unit;
during the $(n+1)^{th}$ phase to the $(n+m-1)^{th}$ phase, maintaining the voltage of the first node at the first voltage based on the second input signal, maintaining the voltage of the second node at the first voltage, and outputting the second voltage from the output terminal of the shift register unit; and
during the $(n+m)^{th}$ phase, providing a reset signal to the reset signal terminal to set the voltage of the first node and the voltage of the second node to the second voltage, and continuing outputting the second voltage from the output terminal of the shift register unit;

wherein a period of the second clock signal comprises K phases, K is an even number greater than 4, n=K/2+1, and m is a natural number greater than 1 and less than n.

18. A shift register comprising a plurality of cascaded shift register units according to claim 1,
- wherein a first input terminal of an $N^{th}$-stage shift register unit is coupled to an output terminal of an $(N-1)^{th}$-stage shift register unit, wherein a second input terminal of the $N^{th}$-stage shift register unit is coupled to an output terminal of an $(N+1)^{th}$-stage shift register unit, wherein an output terminal of the $N^{th}$-stage shift register unit is coupled to a first input terminal of the $(N+1)^{th}$-stage shift register unit, and wherein a reset signal terminal of the $N^{th}$-stage shift register unit is coupled to an output terminal of an $(N+M-1)^{th}$-stage shift register unit;
- wherein a first input terminal of a first-stage shift register unit is inputted by a scan enable signal;
- wherein the first clock signals and the second clock signals inputted to shift register unit at each stage have the same period and amplitude and have opposite phases, and wherein a duty cycle of the first clock signal and a duty cycle of the second clock signal are both ½;
- wherein the phase of the first clock signal inputted to each of the shift register units at stages other than the first stage lags, by 1/K period, with respect to that of the first clock signal inputted to its previous-stage shift register unit; and
- wherein the K is an even number greater than 4, and the M is a natural number greater than K/2 and less than K.

19. An array substrate comprising the shift register according to claim 18.

20. A display apparatus comprising the array substrate according to claim 19.

* * * * *

UNITED STATES PATENT AND TRADEMARK OFFICE
CERTIFICATE OF CORRECTION

PATENT NO. : 10,204,587 B2
APPLICATION NO. : 15/750417
DATED : February 12, 2019
INVENTOR(S) : Mo Chen et al.

It is certified that error appears in the above-identified patent and that said Letters Patent is hereby corrected as shown below:

In the Specification

Column 9, Lines 54-55, delete "$(n+m)^{a'}$ phase" and insert therefor -- $(n+m)^{th}$ phase --.
Column 9, Line 63, delete "$(n+m)^{th}$ a reset signal is) provided" and insert therefor -- $(n+m)^{th}$ phase, a reset signal is provided --.

In the Claims

In Claim 3, Column 12, Line 29, delete "of e fourth transistor" and insert therefor -- of the fourth transistor --.

Signed and Sealed this
Sixteenth Day of April, 2019

Andrei Iancu
*Director of the United States Patent and Trademark Office*